US008605836B2

(12) United States Patent
Murthy et al.

(10) Patent No.: US 8,605,836 B2
(45) Date of Patent: Dec. 10, 2013

(54) AUTOMATIC GAIN CONTROL FOR A WIRELESS RECEIVER

(75) Inventors: Vinay Murthy, San Diego, CA (US); Linbo Li, San Diego, CA (US); Raghuraman Krishnamoorthi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1357 days.

(21) Appl. No.: 11/373,612

(22) Filed: Mar. 9, 2006

(65) Prior Publication Data

US 2006/0222118 A1 Oct. 5, 2006

Related U.S. Application Data

(60) Provisional application No. 60/660,882, filed on Mar. 11, 2005.

(51) Int. Cl.
 *H04L 27/08* (2006.01)
(52) U.S. Cl.
 USPC .................. 375/345; 445/242.1; 445/324
(58) Field of Classification Search
 USPC .................. 375/345, 316; 455/242.1, 324
 See application file for complete search history.

(56) References Cited

U.S. PATENT DOCUMENTS

| | | | |
|---|---|---|---|
| 4,263,560 A | 4/1981 | Ricker | |
| 4,551,688 A | 11/1985 | Craiglow | |
| 4,870,370 A * | 9/1989 | Hedberg et al. | 330/133 |
| 5,917,865 A | 6/1999 | Kopmeiners et al. | |
| 6,321,073 B1 * | 11/2001 | Luz et al. | 455/239.1 |
| 6,510,188 B1 | 1/2003 | Isaksen et al. | |
| 6,591,092 B1 | 7/2003 | Tsuruoka | |
| 6,843,579 B2 | 1/2005 | Chen | |
| 6,843,597 B1 | 1/2005 | Li et al. | |

(Continued)

FOREIGN PATENT DOCUMENTS

| | | |
|---|---|---|
| EP | 1861922 | 3/2006 |
| JP | 2001086179 A | 3/2001 |

(Continued)

OTHER PUBLICATIONS

European Search Opinion—EP09172723, Search Authority—Munich—Dec. 22, 2009.

(Continued)

*Primary Examiner* — Chieh M Fan
*Assistant Examiner* — Freshteh N Aghdam
(74) *Attorney, Agent, or Firm* — Fulbright & Jaworski LLP

(57) ABSTRACT

Techniques for performing automatic gain control (AGC) at a wireless receiver are described. The total gain for the wireless receiver is achieved with discrete gain steps for analog circuitry and continuous gain for a digital variable gain amplifier (DVGA). An AGC loop is updated based on power measurements for an output signal from the DVGA. A first gain for the analog circuitry is selected from among multiple discrete gain values based on the AGC loop to maintain the average power of a baseband signal within a predetermined range at an analog-to-digital converter (ADC) input. A second gain for the DVGA is selected based on the AGC loop to maintain the average power of the output signal at a reference power level. The first gain is switched in a manner to avoid saturation of the ADC caused by the baseband signal and to provide switching hysteresis. The AGC may be performed in log domain and with multiple modes.

34 Claims, 10 Drawing Sheets

(56) References Cited

U.S. PATENT DOCUMENTS

| | | | |
|---|---|---|---|
| 7,218,258 B2 * | 5/2007 | Delanghe et al. | 341/118 |
| 7,460,623 B1 * | 12/2008 | Radionov et al. | 375/345 |
| 2002/0075944 A1 * | 6/2002 | Zalio et al. | 375/147 |
| 2003/1439670 | 7/2003 | Ciccarelli | |
| 2003/0215032 A1 * | 11/2003 | Langlais et al. | 375/345 |
| 2004/0004933 A1 | 1/2004 | Zhu et al. | |
| 2004/0014865 A1 | 1/2004 | Keller et al. | |
| 2004/0097209 A1 * | 5/2004 | Haub et al. | 455/242.1 |
| 2004/0152432 A1 | 8/2004 | Gu | |
| 2005/0032487 A1 | 2/2005 | Montalvo | |
| 2008/0063230 A1 * | 3/2008 | Gao et al. | 381/318 |

FOREIGN PATENT DOCUMENTS

| | | | |
|---|---|---|---|
| JP | 2001144674 A | 5/2001 | |
| JP | 2003037461 A | 2/2003 | |
| JP | 2003283278 A | 10/2003 | |
| JP | 2006504358 A | 2/2006 | |
| TW | 200300309 | 5/2003 | |
| TW | 200302630 | 8/2003 | |
| WO | WO0115342 A1 | 3/2001 | |
| WO | WO0167621 | 9/2001 | |
| WO | WO2004008706 A2 | 1/2004 | |
| WO | WO2004047323 | 6/2004 | |
| WO | WO2004049580 | 6/2004 | |
| WO | 2004082136 A | 9/2004 | |

OTHER PUBLICATIONS

European Search Report—EP09172722, Search Authority—Munich Patent Office, Mar. 16, 2010.

International Search Report and Written Opinion—PCT/US2006/009473, International Search Authority—European Patent Office—Feb. 10, 2006.

Taiwan Search Report—TW095108341—TIPO—Jul. 6, 2012, p. 1.

* cited by examiner

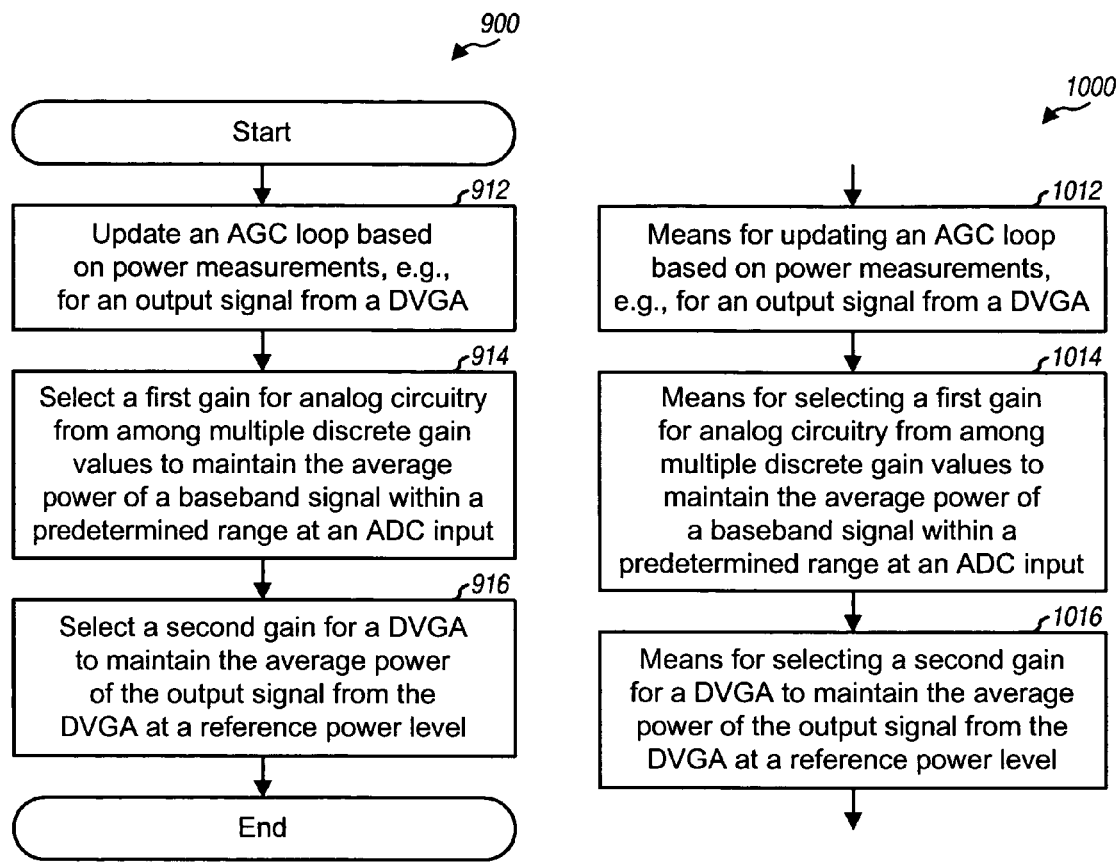

AUTOMATIC GAIN CONTROL FOR A WIRELESS RECEIVER

The present application claims priority to provisional U.S. Application Ser. No. 60/660,882, entitled "AUTOMATIC GAIN CONTROLLER," filed Mar. 11, 2005, assigned to the assignee hereof and incorporated herein by reference.

BACKGROUND

I. Field

The present disclosure relates generally to communication, and more specifically to automatic gain control (AGC) for a wireless receiver.

II. Background

In a wireless communication system, a transmitter typically processes (e.g., encodes and modulates) data and generates a radio frequency (RF) modulated signal that is more suitable for transmission. The transmitter then transmits the RF modulated signal via a wireless channel to a receiver. The wireless channel distorts the transmitted signal with a channel response and further degrades the signal with noise and interference.

The receiver receives the transmitted signal, conditions the received signal to obtain a baseband signal, and digitizes the baseband signal to obtain samples. The received signal level may vary over a wide range due to various channel propagation phenomena such as fading and shadowing. Hence, the receiver typically performs AGC to maintain the baseband signal level within an acceptable range. The AGC attempts to avoid saturation of receiver circuitry and clipping of an analog-to-digital converter (ADC) used to digitize the baseband signal.

AGC may be performed in various manners. In one conventional AGC scheme, one or more analog variable gain amplifiers (VGAs) are used in the receiver, and the gain(s) of the VGA(s) are adjusted to achieve a fixed baseband signal level. This AGC scheme may utilize analog circuitry to detect the baseband signal level and/or to set the gain(s) of the VGA(s). The analog VGA(s) and detection circuitry may complicate the design of the wireless receiver and add cost.

There is therefore a need in the art for techniques to perform AGC at a wireless receiver in an efficient and cost-effective manner.

SUMMARY

Techniques for efficiently performing AGC at a wireless receiver are described herein. In an aspect, the total gain for the wireless receiver is achieved with discrete gain steps for analog circuitry and continuous gain for a digital variable gain amplifier (DVGA). This design can simplify the analog circuitry while providing robust performance.

At the receiver, a received signal is conditioned by the analog circuitry to obtain a baseband signal. The baseband is digitized by an ADC and digitally amplified by the DVGA to generate an output signal. An AGC loop is updated based on power measurements for an output signal from the DVGA. A first gain for the analog circuitry is selected from among multiple discrete gain values based on the AGC loop to maintain the average power of the baseband signal within a predetermined range at the ADC input. A second gain for the DVGA is selected based on the AGC loop to maintain the average power of the output signal at a reference power level. The switching between discrete gain values may be performed in a manner to avoid clipping of the baseband signal, to avoid saturation of the analog circuitry, to provide hysteresis for switching, and to obtain good performance.

In another aspect, AGC is performed in logarithmic (log) domain. A log error in the output signal level is determined, e.g., using base 2 logarithm. The log error is scaled with a loop gain and filtered with a loop filter to obtain a loop filter output. The first gain for the analog circuitry is determined based on the loop filter output. The second gain used to correct the log error in the output signal level is determined based on the loop filter output and the first gain.

In yet another aspect, AGC is performed with multiple modes. The AGC loop may start in an acquisition mode, e.g., upon power up or waking up from sleep. The AGC loop is updated at a first update rate and with a first loop gain value in the acquisition mode. The AGC loop may transition to a tracking mode, e.g., after a predetermined number of AGC loop updates or until satisfaction of an exit condition. The AGC loop is updated at a second update rate that is slower than the first update rate and with a second loop gain value that may or may not be equal to the first loop gain value in the tracking mode. For example, the AGC loop may be updated (1) multiple times for each OFDM symbol in the acquisition mode and (2) once for each OFDM symbol, e.g., at OFDM symbol boundary, in the tracking mode.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

FIGS. 9 and 10 show a process and an apparatus, respectively, for performing AGC with discrete analog gain and continuous digital gain.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

The AGC techniques described herein may be used for various wireless communication systems such as cellular systems, broadcast systems, wireless local area network (WLAN) systems, and so on. The cellular systems may be Code Division Multiple Access (CDMA) systems, Time Division Multiple Access (TDMA) systems, Frequency Division Multiple Access (FDMA) systems, Orthogonal Frequency Division Multiple Access (OFDMA) systems, Single-Carrier FDMA (SC-FDMA) systems, and so on. The broadcast systems may be MediaFLO systems, Digital Video Broadcasting for Handhelds (DVB-H) systems, Integrated Services Digital Broadcasting for Terrestrial Television Broadcasting (ISDB-T) systems, and so on. The WLAN systems may be IEEE 802.11 systems, Wi-Fi systems, and so on. These various systems are known in the art.

The AGC techniques described herein may be used for systems with a single subcarrier as well as systems with multiple subcarriers. Multiple subcarriers may be obtained with OFDM, SC-FDMA, or some other modulation technique. OFDM and SC-FDMA partition a frequency band (e.g., the system bandwidth) into multiple orthogonal subcarriers, which are also called tones, bins, and so on. Each subcarrier may be modulated with data. In general, modulation symbols are sent on the subcarriers in the frequency domain with OFDM and in the time domain with SC-FDMA. OFDM is used in various systems such as MediaFLO, DVB-H and ISDB-T broadcast systems, IEEE 802.11a/g WLAN systems, and some cellular systems. Certain aspects and embodiments of the AGC techniques are described below for a broadcast system that uses OFDM, e.g., a MediaFLO system.

Figure 1:
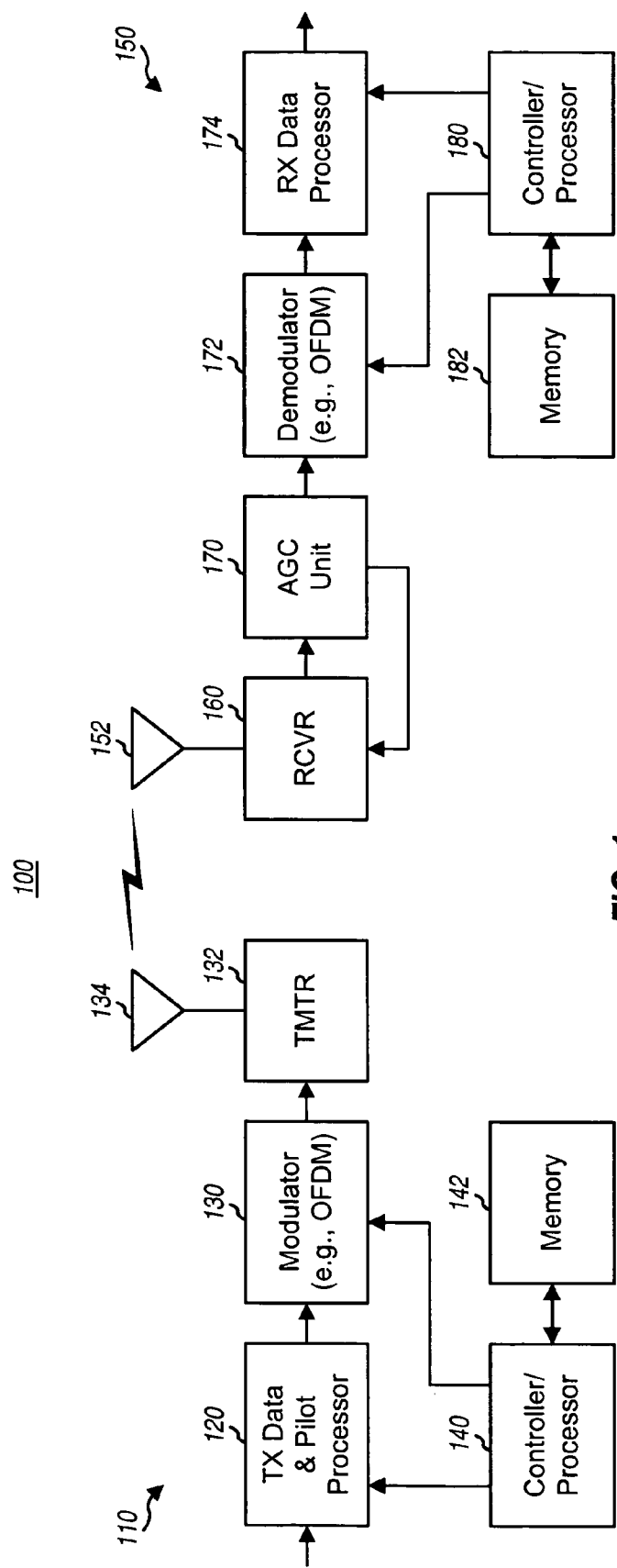
FIG. 1 shows a block diagram of a transmitter and a receiver.

FIG. 1 shows a block diagram of a transmitter 110 and a receiver 150 in a wireless communication system 100. Transmitter 110 may be part of a base station, and receiver 150 may be part of a terminal. Conversely, transmitter 110 may be part of a terminal, and receiver 150 may be part of a base station. A base station is typically a fixed station and may also be called a base transceiver system (BTS), an access point, a Node B, and so on. A terminal may be fixed or mobile and may also be called a mobile station, a user equipment, a mobile equipment, and so on. A terminal may be a cellular phone, a personal digital assistant (PDA), a wireless modem, a wireless communication device, a handheld device, a subscriber unit, and so on.

At transmitter 110, a transmit (TX) data and pilot processor 120 processes (e.g., encodes, interleaves, and symbol maps) traffic data and generates data symbols. Processor 120 also generates pilot symbols. As used herein, a data symbol is a modulation symbol for data, a pilot symbol is a modulation symbol for pilot, and a modulation symbol is a complex value for a point in a signal constellation, e.g., for PSK or QAM. A modulator 130 multiplexes the data symbols and pilot symbols, performs OFDM modulation on the multiplexed data and pilot symbols, and generates OFDM symbols. A transmitter unit (TMTR) 132 processes (e.g., converts to analog, amplifies, filters, and frequency upconverts) the OFDM symbols and generates a modulated signal, which is transmitted via an antenna 134.

At receiver 150, an antenna 152 receives the modulated signal from transmitter 110 and provides a received signal to a receiver unit (RCVR) 160. Receiver unit 160 conditions (e.g., filters, amplifies, and frequency downconverts) the received signal to obtain a baseband signal and further digitizes the baseband signal to obtain input samples. An AGC unit 170 performs automatic gain control, adjusts the gain of receiver unit 160 as appropriate, multiplies the input samples with a variable digital gain, and provides output samples having the desired average power. A demodulator 172 performs OFDM demodulation on the output samples and provides data symbol estimates, which are estimates of the data symbols sent by transmitter 110. A receive (RX) data processor 174 processes (e.g., symbol demaps, deinterleaves, and decodes) the data symbol estimates and provides decoded data. In general, the processing at receiver 150 is complementary to the processing at transmitter 110.

Controllers/processors 140 and 180 direct the operation of various processing units at transmitter 110 and receiver 150, respectively. Memories 142 and 182 store program codes and data for transmitter 110 and receiver 150, respectively.

Figure 2:
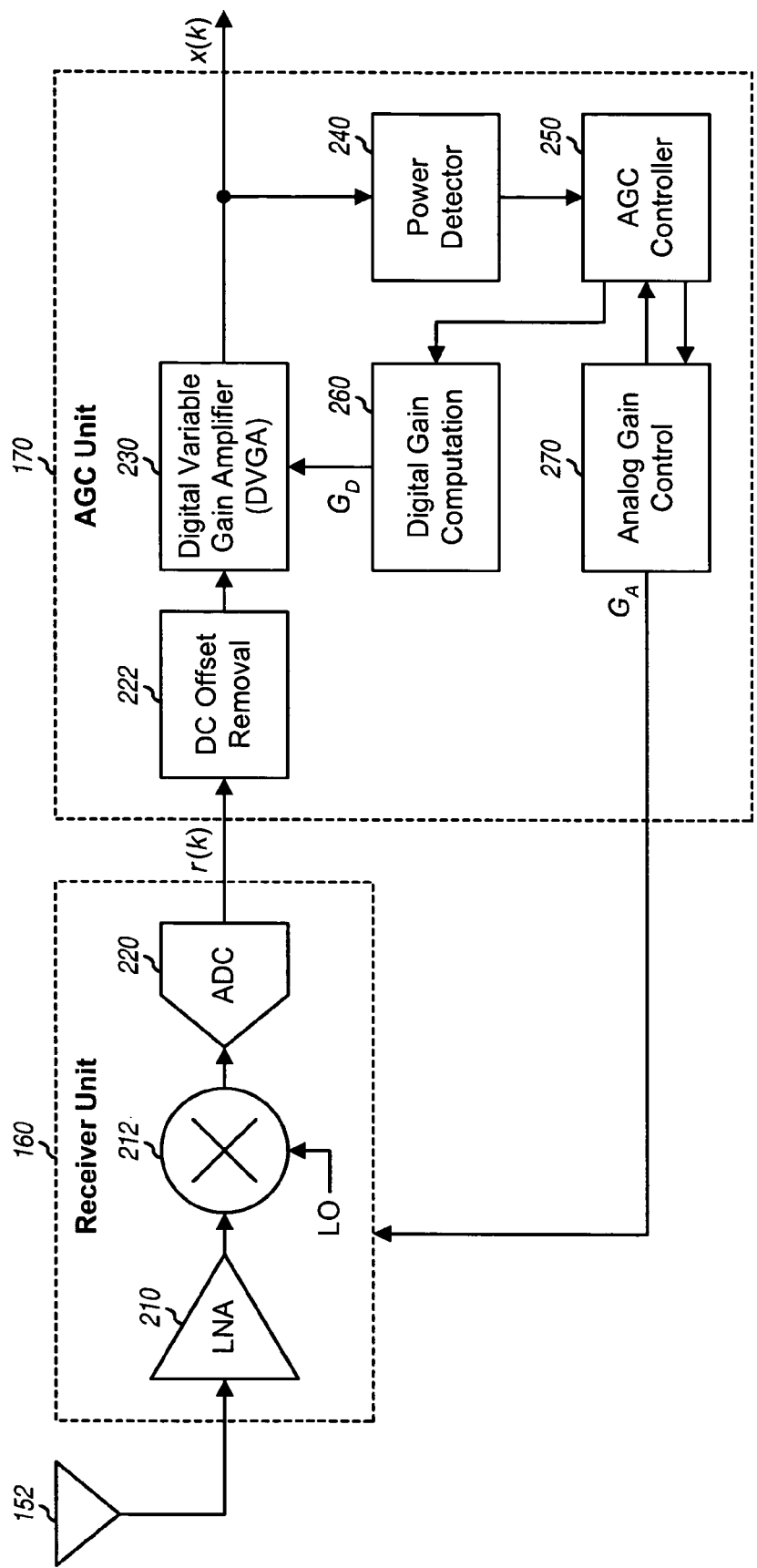
FIG. 2 shows a block diagram of a receiver unit and an AGC unit.

FIG. 2 shows a block diagram of an embodiment of receiver unit 160. Within receiver unit 160, a low noise amplifier (LNA) 210 amplifies the received signal from antenna 152 with a fixed or variable gain and provides an amplified signal. A mixer 212 frequency downconverts the amplified signal with a local oscillator (LO) signal and provides a baseband signal. Mixer 212 may also amplify its input signal and/or output signal with a fixed or variable gain. Mixer 212 may implement a super-heterodyne architecture that downconverts the received signal in multiple stages, e.g., from RF to an intermediate frequency (IF), and then from IF to baseband. Mixer 212 may also implement a direct-to-baseband architecture, which is also referred to as a zero IF (ZIF) architecture, that downconverts the received signal directly from RF to baseband in one stage. An ADC 220 digitizes the baseband signal and provides input samples r(k) to AGC unit 170, where k is an index for sample period. ADC 220 may be a sigma-delta ADC ($\Sigma\Delta$ ADC), a successive approximation ADC, or some other type of ADC. The input samples are typically complex-valued samples having inphase (I) and quadrature (Q) components.

For simplicity, FIG. 2 shows only some of the circuit blocks that may be used in a receiver unit. In general, a receiver unit may include one or more stages of amplifier, filter, mixer, and so on. For example, a bandpass filter may be provided before mixer 212, and a lowpass filter may be provided after mixer 212. A receiver unit may also include any number of circuit blocks with variable gain, and these circuit blocks may be located anywhere in the receive path. For example, LNA 210 and/or mixer 212 may have variable gain.

The received signal level may vary over a very wide range, e.g., from −98 dBm to −20 dBm. This wide receive dynamic range may result from various channel propagation phenomena such as fading and shadowing. The received signal may also include interfering signals (or "jammers") that may be much larger in amplitude than a desired signal. In the following description, the terms "power", "energy", "signal level" and "signal strength" are used interchangeably and refer to the amplitude of a signal.

AGC may be used to account for the wide dynamic range of the received signal, to maintain the baseband signal level within a suitable range for the ADC, and to provide output samples having approximately constant average power. The AGC design may be dependent on various factors such as the dynamic range of the received signal (or receive dynamic range), the input dynamic range of the ADC (or ADC input dynamic range), the manner in which the analog gain is varied in the receiver unit, and so on. For example, the receive dynamic range and the ADC input dynamic range may determine the range of analog gains needed for the receiver unit and the specific analog gains to use for different received signal levels.

In an aspect, AGC is achieved using analog gain that may be varied in coarse discrete steps and digital gain that may be varied continuously or in fine steps. The discrete gain steps in the analog domain may simplify the design of the receiver unit and may reduce cost. The continuous digital gain may be implemented in a cost-effective manner with digital circuitry.

For clarity, a specific embodiment of receiver unit 160 and AGC unit 170 is described below. In this embodiment, the AGC has four states. The AGC states may also be referred to as gain states, AGC gain states, receiver states, gain modes, and so on. Each AGC state is associated with a specific analog gain. The AGC operates in one of the four AGC states at any given moment. This AGC state is selected based on the received signal level. Receiver unit 160 operates with the analog gain associated with the selected AGC state.

Figure 3:
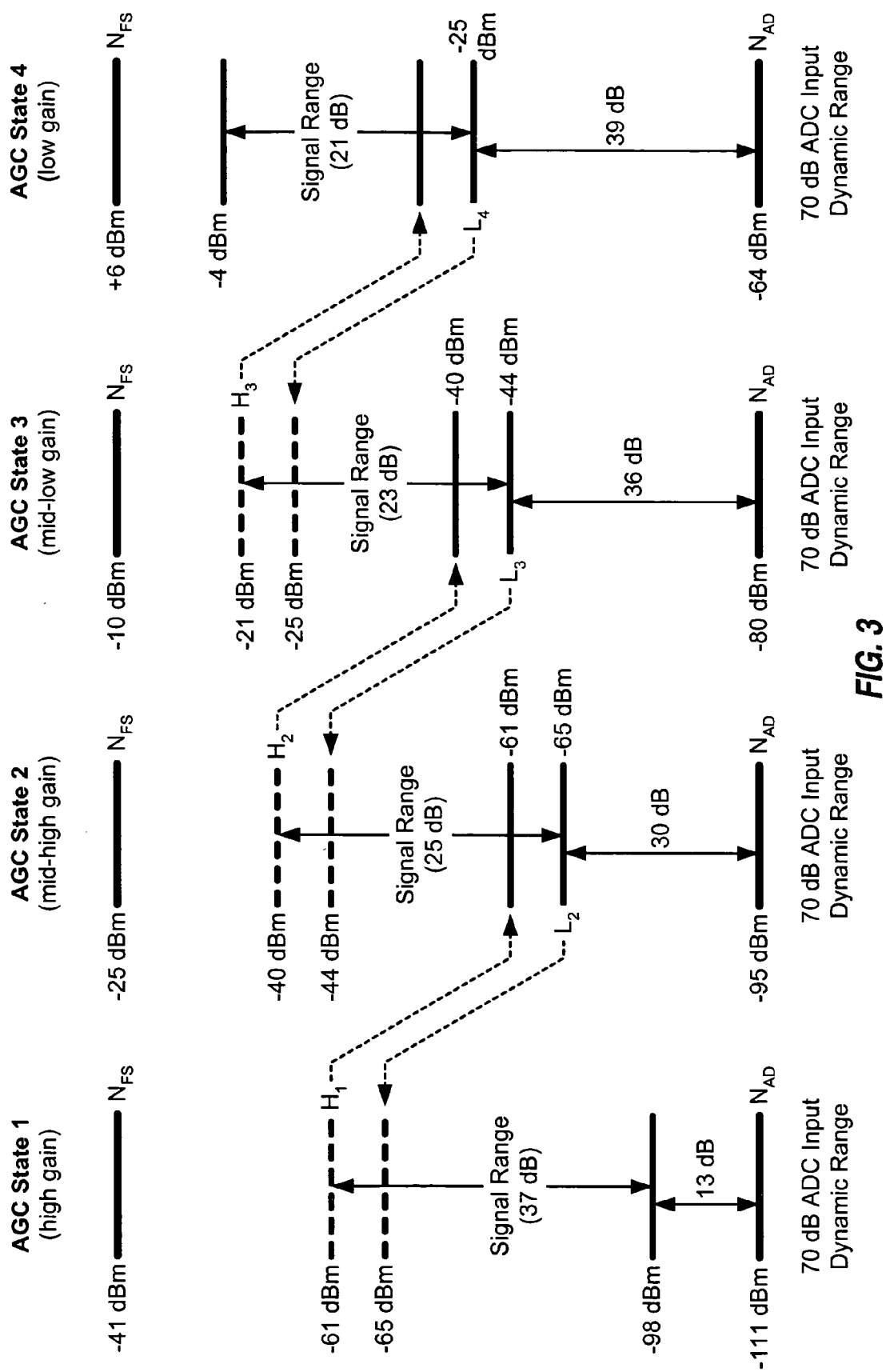
FIG. 3 shows plots of discrete gains and switching for four AGC states.

FIG. 3 shows exemplary plots of the discrete gains and switching for the four AGC states. In this embodiment, the dynamic range of the received signal is −98 dBm to −20 dBm, and the input dynamic range of the ADC is 70 dB. The four AGC states 1, 2, 3 and 4 are associated with analog gains of x+47 dB, x+31 dB, x+16 dB, and x dB, respectively, where x is the smallest analog gain and is dependent on the receiver design. AGC state 1 has the highest analog gain, and AGC state 4 has the lowest analog gain.

FIG. 3 shows the four AGC states from the perspective of, and referenced to, the ADC input. For each AGC state, the top horizontal line represents the ADC fullscale, $N_{FS}$, and the bottom horizontal line represents the ADC quantization noise floor, $N_{AD}$. The difference between the top and bottom horizontal lines represents the ADC input dynamic range.

FIG. 3 also shows an exemplary mapping of the received signal level to the ADC input dynamic range for each of the four AGC states. In the embodiment shown in FIG. 3, the receive dynamic range of −98 dBm to −20 dBm is broken up into four overlapping signal ranges. The first signal range covers −98 dBm to −61 dBm, the second signal range covers −65 dBm to −40 dBm, the third signal range covers −44 dBm to −21 dBm, and the fourth signal range covers −25 dBm to −4 dBm. In this embodiment, the signal ranges overlap one another by 4 dB. The first through fourth signal ranges are covered by AGC states 1 through 4, respectively. The mapping of the received signal power at the antenna connector the ADC input dynamic range is shown in FIG. 3. The signal range for each AGC state is represented by a vertical line labeled as "signal range".

In the embodiment shown in FIG. 3, AGC state 1 is selected when the received signal level at the antenna connector is between −98 dBm to −61 dBm. For increasing received signal level at the antenna connector, AGC state 2 is selected when the received signal level exceeds −61 dBm, AGC state 3 is selected when the received signal level exceeds −40 dBm, and AGC state 4 is selected when the received signal level exceeds −21 dBm. For decreasing received signal level, starting at AGC state 4, AGC state 3 is selected when the received signal level falls below −25 dBm, AGC state 2 is selected when the received signal level falls below −44 dBm, and AGC state 1 is selected when the received signal level falls below −65 dBm.

FIG. 3 also shows the high and/or low switching threshold for each AGC state. Each AGC state m, for m=1, 2, 3, is associated with a high threshold $H_m$ of the received signal level. The next AGC state m+1 with lower analog gain is selected if the received signal level exceeds the high threshold $H_m$. Each AGC state m, for m=2, 3, 4, is associated with a low threshold $L_m$ of the received signal level. The next AGC state m−1 with higher analog gain is selected if the received signal level falls below the low threshold $L_m$.

In the embodiment shown in FIG. 3, a hysteresis of 4 dB is used to switch between AGC states. For example, a switch from AGC state 2 to AGC state 1 is made if the received signal level falls below −65 dBm, and a switch from AGC state 1 back to AGC state 2 is made if the received signal level exceeds −61 dBm, which is 4 dB higher. This 4 dB of hysteresis requires the received signal level to move by 4 dB in the opposite direction before switching back to the prior AGC state, which prevents continual toggling between AGC states due to random fluctuations in power measurements. The amount of hysteresis may be selected to provide good performance and may be a fixed or programmable value.

As shown in FIG. 3, the signal range for each AGC state is well within the ADC input dynamic range. One design goal is to maintain the lowest received signal level for each AGC state at least a designated amount (e.g., 13 dB) above the ADC quantization noise floor in order to achieve a desired signal-to-quantization noise ratio (SQR). Another design goal is to maintain the highest average received signal level for each AGC state at least a predetermined amount (e.g., 11 dB) below the ADC fullscale in order to avoid saturation of the ADC. This predetermined amount below the ADC fullscale is referred to as an ADC backoff. The ADC backoff accounts for high peak-to-average-power ratio (PAPR) of an OFDM waveform and prevents high-energy signal points from saturating the ADC. The ADC backoff may also account for jammers in the received signal and to avoid saturation of the ADC when jammers are present. In general, the average power of the desired signal plus jammer should be the predetermined amount below the ADC fullscale. The switching thresholds may be selected to achieve these goals.

In the embodiment shown in FIG. 3, the four signal ranges for the four AGC states are mapped to different regions of the ADC input dynamic range. In AGC state 1, the signal range is only 13 dB above the ADC quantization noise floor. Boosting the analog gain in AGC state 1 may not improve the SNR (signal-to-noise ratio) since thermal noise and received signal would be boosted by the same amount. A larger ADC backoff in AGC state 1 may be beneficial to handle large jammers relative to a weak desired signal in AGC state 1.

FIG. 3 shows exemplary plots for the four AGC states. The AGC states may also be defined in other manners. In general, any number of AGC states may be defined, and each AGC state may cover any range of received signal level such that good performance may be achieved for receiver 150. FIG. 3 also shows an exemplary hysteresis of 4 dB and exemplary high and low thresholds, which are given as examples for illustration purposes. Other values may also be used for the hysteresis and the high and low thresholds.

FIG. 2 also shows a block diagram of an embodiment of AGC unit 170 at receiver 150. AGC unit 170 attempts to compress the wide dynamic range of the received signal to fit into the smaller input dynamic range of ADC 220 in order to avoid saturation of the ADC and achieve an acceptable SQR. AGC unit 170 also attempts to provide output samples having constant average power for subsequent processing.

Within AGC unit 170, a DC offset removal unit 222 estimates and removes direct current (DC) offset in the input samples. A DVGA 230 multiplies the samples from unit 222 with a variable digital gain $G_D$ and provides output samples x(k) having the desired average power. A power detector 240 determines the power of the output samples r(k) and provides power measurements P(n), where n is an index for AGC update interval. An AGC controller 250 receives the power measurements and determines the error between the measured power and a reference power level, which is also referred to as a DVGA setpoint. AGC controller 250 filters the error and provides to an analog gain control unit 270 a control signal a(n) that is indicative of the average power of the baseband signal at the input of ADC 220 relative to the DVGA setpoint. Unit 270 selects a suitable analog gain step $G_A$ for receiver unit 160 based on the control signal a(n). If a new analog gain step is selected, then unit 270 provides to AGC controller 250 a gain change c(n), which is the difference in the analog gains for the new and prior AGC states. AGC controller 250 provides to a digital gain computation unit 260 a control signal d(n) that is indicative of the average power of the baseband signal, after taking into account the analog gain $G_A$ to be applied to receiver unit 160. Unit 260 selects a suitable digital gain $G_D$ for DVGA 230 such that the average power of the output samples is maintained at or near the DVGA setpoint.

In an embodiment, AGC unit 170 supports multiple operating modes, e.g., an acquisition mode and a tracking mode. In the acquisition mode, AGC loop update is performed at a faster rate and with a first loop gain value to achieve faster convergence. If the update rate is fast, then a small loop gain value may be used to achieve a good trade-off between convergence rate and time averaging. In the tracking mode, AGC is performed at a slower rate and with a second loop gain value to achieve a good balance between rate of convergence and time averaging. The operation of some blocks within AGC unit 170 is dependent on the AGC operating mode.

Power detector 240 determines the power of the output samples x(k) relative to the DVGA setpoint of DVGA 230. In an embodiment, power detector 240 computes the power as follows:

$$P(n) = \frac{1}{L} \cdot \sum_{k=1}^{L} |x_n(k)|^2, \qquad \text{Eq (1)}$$

where $x_n(k)$ is the k-th output sample in update interval n, and P(n) is the power measurement for update interval n.

In general, the power measurements P(n) may be obtained based on the same number of output samples for all update intervals or different numbers of output samples for different update intervals. In an embodiment, P(n) is obtained based on fewer (e.g., 128) samples in the acquisition mode and more (e.g., 2048) samples in the tracking mode. This allows the AGC to be updated at a higher rate in the acquisition mode and obtain a more accurate energy estimation for tracking mode.

Figure 4:
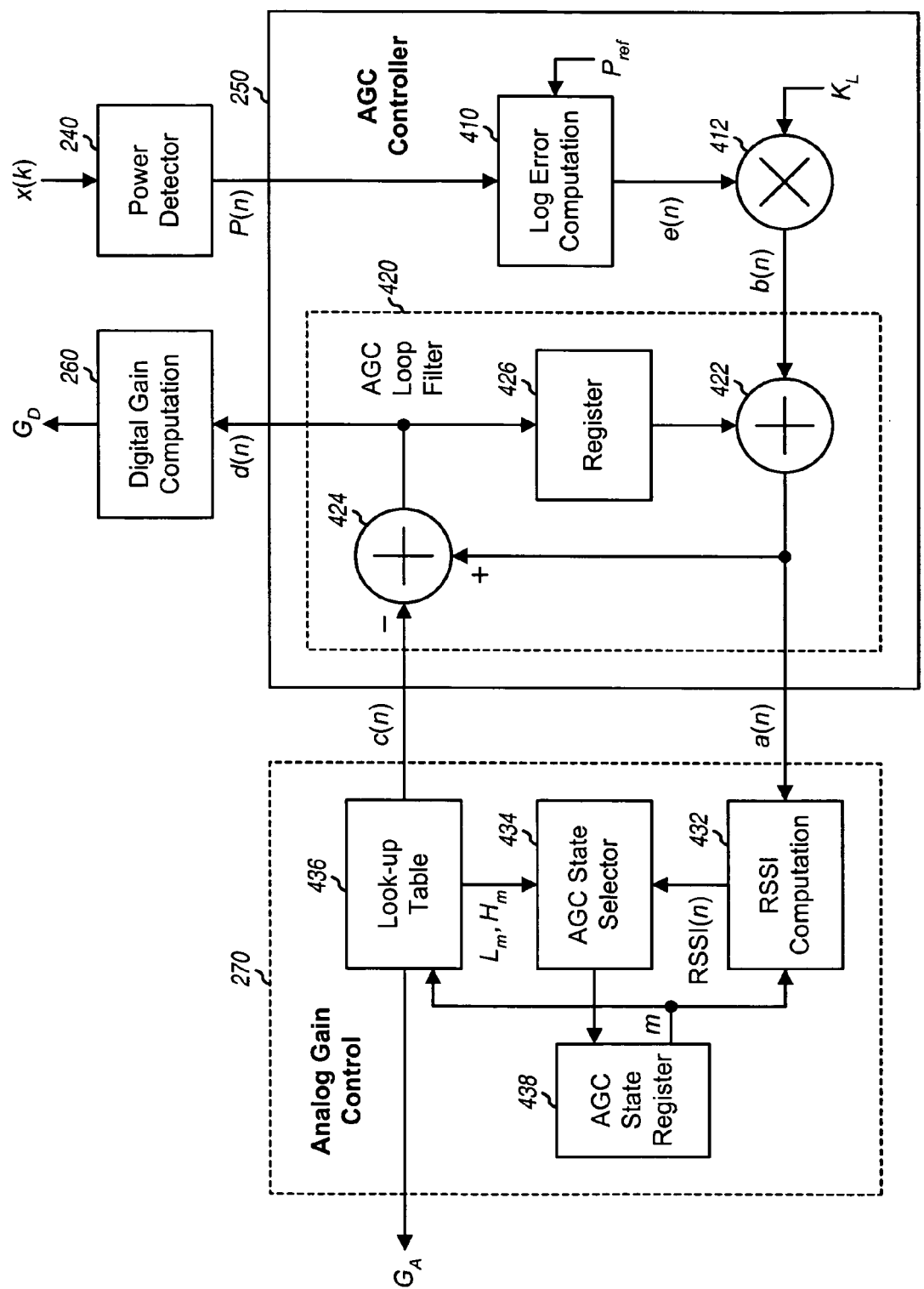
FIG. 4 shows a block diagram of an AGC controller.

FIG. 4 shows a block diagram of an embodiment of AGC controller 250 and analog gain control unit 270 within AGC unit 170. In this embodiment, an AGC loop is implemented in the logarithmic (log) domain, and most of the quantities within the AGC loop are in units of decibels (dB). Operating the AGC loop in the log domain may provide various benefits, as described below. In other embodiments, the AGC loop may be implemented in the linear domain. A log-domain AGC loop is described below.

Within AGC controller 250, a log error computation unit 410 receives the power measurements P(n) from power detector 240 and the DVGA setpoint $P_{ref}$ that determines the average power of the output samples. DVGA 230 is implemented with a particular number of bits and has a particular range. A high DVGA setpoint increases the likelihood of clipping high-energy samples whereas a low DVGA setpoint degrades the SQR (signal-to-quantization noise ratio). The DVGA setpoint may be set to a particular value (e.g., 11 dB below the DVGA fullscale) based on a tradeoff between these two considerations. In each update interval n, unit 410 determines the log of the error between the power measurement P(n) and the DVGA setpoint $P_{ref}$ and provides a log error e(n), which may be expressed as:

$$e(n) = \log_2(P_{ref} / P(n)), \qquad \text{Eq (2)}$$

-continued
$$= \log_2(P_{ref}) - \log_2(P(n)).$$

In the embodiment shown in equation (2), the error e(n) is derived using base 2 logarithm, or $\log_2$. The use of $\log_2$ arithmetic for the AGC loop may provide certain advantages. First, DVGA 230 may be efficiently implemented with a combination of shifts and low bitwidth multipliers. Second, faster convergence may be achieved with $\log_2$ arithmetic over linear arithmetic. Third, power variation, which is a multiplicative distortion in the linear domain, becomes an additive distortion in the log domain and may be mitigated with linear feedback techniques. Fourth, symmetric transient responses may be achieved for both strong and weak signals with a log-domain AGC loop.

A multiplier 412 multiplies the log error e(n) with a loop gain $K_L$ and provides a scaled log error b(n). The loop gain $K_L$ determines the convergence rate of the AGC loop. A suitable loop gain value may be used in each mode to achieve the desired convergence rate and time averaging.

An AGC loop filter 420 filters the scaled log error b(n) and provides loop filter outputs. Within AGC loop filter 420, a summer 422 sums the scaled log error b(n) with an output of a register 426 and provides a first loop filter output a(n) to analog gain control unit 270. For a given AGC state, the digital gain $G_D$ is determined by the first loop filter output a(n). Since the digital gain $G_D$ will amplify the input samples to the fixed DVGA setpoint, the average power of the input samples is $G_D$ dB below the DVGA setpoint. Hence, for a given AGC state and in the absence of clipping, the first loop filter output a(n) is indicative of the average power of the baseband signal at the input of ADC 220 relative to the DVGA setpoint, in units of dB.

Analog gain control unit 270 determines whether to remain in the current AGC state or transition to a new AGC state so that the baseband signal level is maintained within the desired range at the ADC input, as shown in FIG. 3. Within unit 270, a receive signal strength indication (RSSI) computation unit 432 receives the first loop filter output a(n) from loop filter 420 and the current AGC state m from a register 438. Unit 432 determines the average power of the baseband signal, RSSI (n), as follows:

$$\text{RSSI}(n) = f\{a(n), m\}, \qquad \text{Eq (3)}$$

where $f\{a(n), m\}$ is a function of a(n) and m and may be dependent on the design of AGC unit 170. An AGC state selector 434 receives RSSI(n) from unit 432 and the high and low thresholds $H_m$ and $L_m$ for the current AGC state m from a look-up table 436. Selector 434 determines whether to stay in the current AGC state or switch to another AGC state based on its inputs, as described below. If a new AGC state is selected, then register 438 stores the new AGC state, and look-up table 436 issues command to analog circuitry (e.g., LNA 210, mixer 212, or both in FIG. 2) to switch the AGC gain state as well as the gain change c(n) for the AGC gain state transition. The gain change c(n) is non-zero if a new AGC state is selected and is zero if the current AGC state is maintained.

Within loop filter 420, a summer 424 subtracts the gain change c(n) from the first loop filter output a(n) and provides a second loop filter output d(n) to digital gain computation unit 260. Whenever a new AGC state is selected, the analog gain changes and the baseband signal level at the ADC input jumps, as shown in FIG. 3. The second loop filter output d(n) indicates the expected power of the baseband signal relative to the DVGA setpoint with the new AGC state.

Digital gain computation unit 260 computes the digital gain $G_D$ for DVGA 230 based on the second loop filter output d(n) such that the power of the output samples is at or near the DVGA setpoint. The digital gain $G_D$ tracks variations in the received signal level and also compensates for step changes in the analog gain. The digital gain $G_D$ may be provided in two parts—a first part that is a power of two and a second part that is in linear unit. Multiplication of the input samples with the first part may be easily achieved with bit shift operations. Multiplication of the input samples with the second part may be achieved using low bitwidth multipliers.

Delays are typically encountered in applying new analog and digital gains. The delay in applying a new analog gain may be longer than the delay in applying a new digital gain. This may be due to various reasons such as, e.g., a longer delay in providing the new analog gain to receiver unit 160, additional delay in switching the gain(s) of circuit block(s) within receiver unit 160, and so on. Although not shown in FIG. 4 for simplicity, the gain change c(n) may be delayed by an amount equal to the difference in the delays for applying the new analog and digital gains. This way, when a new analog gain is selected, the new analog gain and the corresponding new digital gain may occur concurrently, and large transients in the output samples may be avoided.

In the embodiment shown in FIG. 4, the AGC loop is implemented with a first-order feedback loop that determines both the analog and digital gains. This AGC loop design is sufficient because the received signal level typically varies slowly from one update interval to the next. Other types of feedback loop, multiple feedback loops, a feed-forward structure, and/or some other design may also be used to control the analog and digital gains.

Analog gain control unit 270 may initially select AGC state 1 with the highest analog gain, e.g., at power up. Thereafter, in each update interval, unit 270 may compare the average power of the baseband signal, RSSI(n), against the high and low thresholds for the current AGC state to determine whether to switch to another AGC state. Look-up table 436 within unit 270 may store the high and low thresholds for each AGC state as well as the step change in the analog gain when switching between AGC states, e.g., as show in Table 1. The specific values for the high and low thresholds, the calculation of RSSI, and the gain changes are dependent on implementation and may vary from design to design.

TABLE 1

| AGC State m | Gain Change from m to m + 1 | High Threshold | Low Threshold |
|---|---|---|---|
| 1 | $C_{12}$ | $H_1$ | N/A |
| 2 | $C_{23}$ | $H_2$ | $L_2$ |
| 3 | $C_{34}$ | $H_3$ | $L_3$ |
| 4 |  | N/A | $L_4$ |

Different operating characteristics may be obtained by selecting different values for the high and low thresholds. The high and low thresholds determine at what power level to switch AGC state and hence determine the partitioning of the overall gain between the analog and digital domains. The high and low thresholds also determine the amount of hysteresis, which may be computed as follows:

$$\text{Hysteresis} = H_m - L_{m+1}. \quad \text{Eq (4)}$$

Figure 5:
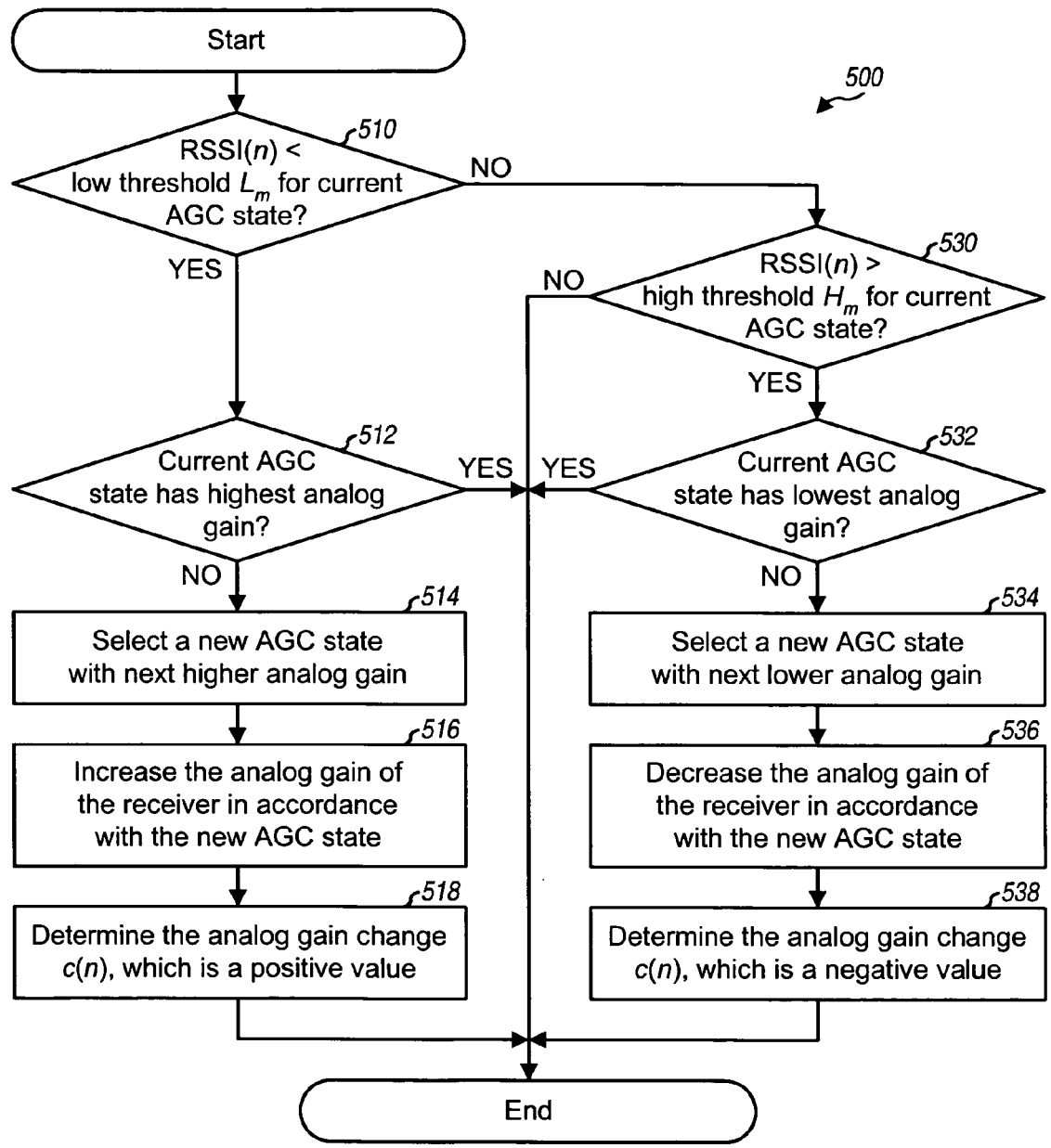
FIG. 5 shows a process for selecting AGC state.

FIG. 5 shows an embodiment of a process 500 for selecting AGC state, which may be performed by AGC state selector 434 in FIG. 4. The following description assumes that AGC state m is the current AGC state, where $m \in \{1, 2, 3, 4\}$. Initially, a determination is made whether the average power of the baseband signal, RSSI(n), is below the low threshold $L_m$ for the current AGC state m (block 510). If the answer is 'Yes', then higher analog gain is desirable. A determination is then made whether the current AGC state has the highest analog gain (block 512). If the answer is 'Yes', then the process terminates because the receiver unit is already operating at the highest analog gain. Otherwise, if the answer is 'No' for block 512, then a new AGC state m−1 with the next higher analog gain is selected (block 514). The analog gain for the receiver unit is increased in accordance with the new AGC state (block 516). The gain change c(n) is then determined as the difference between the analog gain for the new AGC state m−1 and the analog gain for the prior AGC state m (block 518). The gain change c(n) in the logarithm domain is a positive value since a higher analog gain is being used for the receiver unit.

If the average power of the baseband signal is not below the low threshold $L_m$ for the current AGC state m and the answer is 'No' for block 510, then a determination is made whether RSSI(n) exceeds the high threshold $H_m$ for the current AGC state m (block 530). If the answer is 'Yes' for block 530, then lower analog gain is desirable. A determination is then made whether the current AGC state has the lowest analog gain (block 532). If the answer is 'Yes', then the process terminates because the receiver unit is already operating at the lowest analog gain. Otherwise, if the answer is 'No' for block 532, then a new AGC state m+1 with the next lower analog gain is selected (block 534). The analog gain for the receiver is decreased in accordance with the new AGC state (block 536). The gain change c(n) is then determined as the difference between the analog gains for the new and prior AGC states (block 538). The gain change c(n) in the logarithm domain is a negative value since a lower analog gain is being used for the receiver unit.

FIG. 5 shows an embodiment in which the average power of the baseband signal is used to select AGC state. As noted above, the first loop filter output a(n) is indicative of the average power of the baseband signal at the ADC input relative to the DVGA setpoint and may also be used to select AGC state. However, since a(n) is inversely related to the baseband signal level, blocks 510 and 530 in FIG. 5 may be modified accordingly. Furthermore, suitable high and low thresholds may be defined for a(n) and used to select AGC state.

Figure 6:
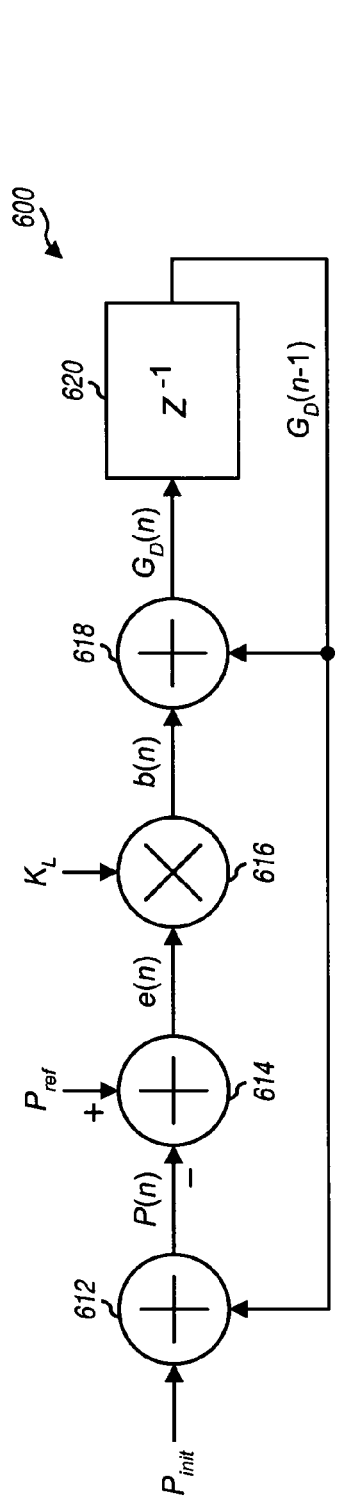
FIG. 6 shows an exemplary model of an AGC loop for the DVGA.

FIG. 6 shows a block diagram of an exemplary model 600 for the AGC loop for DVGA 230. In this embodiment, the AGC loop is implemented as a first-order feedback loop that operates in the log domain. Hence, the quantities in model 600 are given in units of dB or logarithm with any base. Model 600 assumes that the AGC is operating in one AGC state and that the gain change c(n) is equal to zero in each update interval.

In each AGC update interval n, a summer 612 sums the input power $P_{init}$ at the input of the DVGA with the digital gain $G_D(n-1)$ for the DVGA and provides the power P(n) at the output of the DVGA. A summation in the log domain is equivalent to multiplication in the linear domain. Summer 612 models the multiplication in the linear domain by DVGA 230. A summer 614 subtracts the DVGA output power P(n) from the DVGA setpoint $P_{ref}$ and provides the log error e(n). A multiplier 616 multiplies the log error e(n) with the loop gain $K_L$ and provides the scaled log error b(n). A summer 618 sums the scaled log error b(n) with the digital gain $G_D(n-1)$ from a delay unit 620 and provides the updated digital gain $G_D(n)$. Delay unit 620 stores the digital gain $G_D(n)$ from summer 618 and provides this digital gain in the next update interval. Delay unit 620 models register 426 in FIG. 4.

The transfer function for model 600 may be readily derived by one skilled in the art. The time constant of the first-order feedback loop, $\tau$, may be expressed as:

$$\tau = \frac{1}{|\ln(1 - K_L)|} \cdot T_L, \qquad \text{Eq (5)}$$

where $T_L$ is the time interval between two AGC loop updates. $T_L$ may be different for the acquisition mode and the tracking mode. For a small loop gain $K_L$, the time constant may be approximated as $\tau \approx T_L/K_L$, which corresponds to the effective length of the averaging window for the loop filter. For a small $K_L$, the time constant and the averaging window are longer, resulting in a slower convergence of the AGC loop. For a large $K_L$, convergence is fast. However, measurement noise is less suppressed through the averaging window, which may be disadvantageous for measurement accuracy.

A residual tracking error is an error in the average power of the output samples due to errors in the power measurements. The variance of the residual tracking error, $\sigma_{re}^2$, may be expressed as:

$$\sigma_{re}^2 = \frac{K_L}{2 - K_L} \cdot \sigma_\varepsilon^2, \qquad \text{Eq (6)}$$

where $\sigma_\varepsilon^2$ is the variance of the power measurement error. Equation (6) indicates that the residual tracking error is dependent on both the loop gain $K_L$ and the power measurement error $\sigma_\varepsilon^2$.

A suitable value may be selected for the loop gain $K_L$ to achieve good performance in terms of convergence rate, residual tracking error, and possibly other criteria. If $\sigma_\varepsilon^2$ is negligible, e.g., by averaging over a sufficient number of samples, then a higher loop gain $K_L$ may be used to achieve faster convergence. Conversely, if the power measurements are noisy, then a smaller loop gain $K_L$ may be used to average out the noise. In an embodiment, $K_L$ is a 4-bit value that ranges from $1/16$ to $15/16$. For this embodiment, the maximum time constant is approximately 16 update intervals.

The loop gain $K_L$ may also be selected to minimize packet error rate (PER) for different channel profiles. A higher $K_L$ may provide better performance for multipath fading channels and Rayleigh flat fading at low to medium speed. A lower $K_L$ may provide better performance for flat fading at very high speed. The channel profile for receiver 150 may be determined, and a suitable loop gain value may be selected for use based on the determined channel profile.

Receiver 150 may perform AGC in various manners, e.g., depending on the waveform used by the system, the operating mode of the receiver, and so on. As an example, for an OFDM waveform, it may be desirable to update the AGC loop and the analog and digital gains at OFDM symbol boundaries to reduce transients in the received OFDM symbols.

Figure 7:
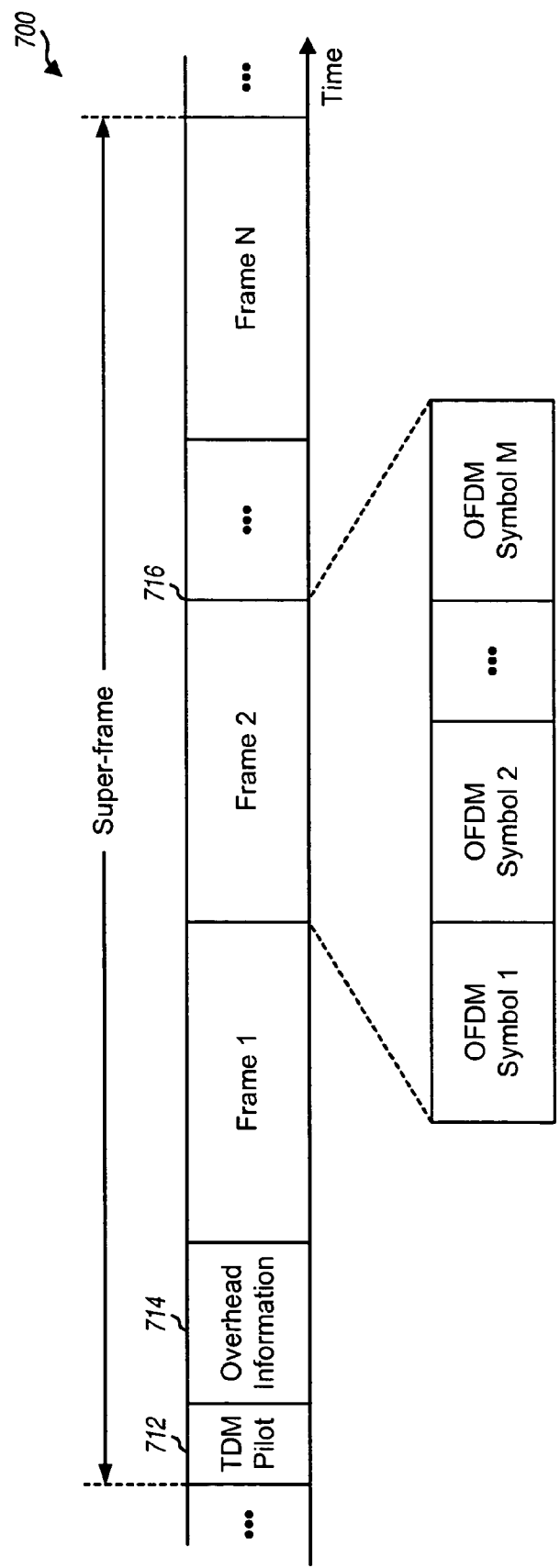
FIG. 7 shows an exemplary super-frame structure.

FIG. 7 shows an exemplary super-frame structure 700 that may be used for system 100. In the embodiment shown in FIG. 7, the transmission timeline is partitioned into super-frames, with each super-frame having a particular time duration, e.g., approximately one second. Each super-frame includes a field 712 for a time division multiplexed (TDM) pilot, a field 714 for overhead/control information, and a field 716 with N frames for traffic data, where N≥1. A super-frame may also include different and/or additional fields not shown in FIG. 7.

In the embodiment shown in FIG. 7, the TDM pilot is composed of S identical pilot sequences, with each pilot sequence containing L time-domain samples, where S>1 and L>1. The TDM pilot may be used for signal detection, frame synchronization, frequency error estimation, time synchronization and/or other purposes. The overhead information may convey information used to recover the data channels sent in the N frames of the super-frame. Each frame carries multiple (M) OFDM symbols. Each OFDM symbol is composed of a data portion of K samples and a cyclic prefix of C samples. In an embodiment, K=4096, C=512, and each OFDM symbol is composed of 4608 samples. In an embodiment, L=128, S=36, and the TDM pilot contains 36 identical pilot sequences of length 128. Other values may also be used for K, C, L and S.

FIG. 7 shows a specific super-frame structure. The AGC techniques described herein may be used with other frame and super-frame structures.

Receiver 150 may be intermittently active and may wake up periodically to receive data. For example, a data channel of interest may be sent in one or more OFDM symbols in each frame. Receiver 150 may then wake up prior to the OFDM symbol(s) for the data channel of interest, update the analog and digital gains as necessary, adjust its frequency and timing, receive the OFDM symbol(s) of interest, and go back to sleep until the next frame. It is desirable for the AGC to converge quickly at the start of each wakeup interval.

Figure 8:
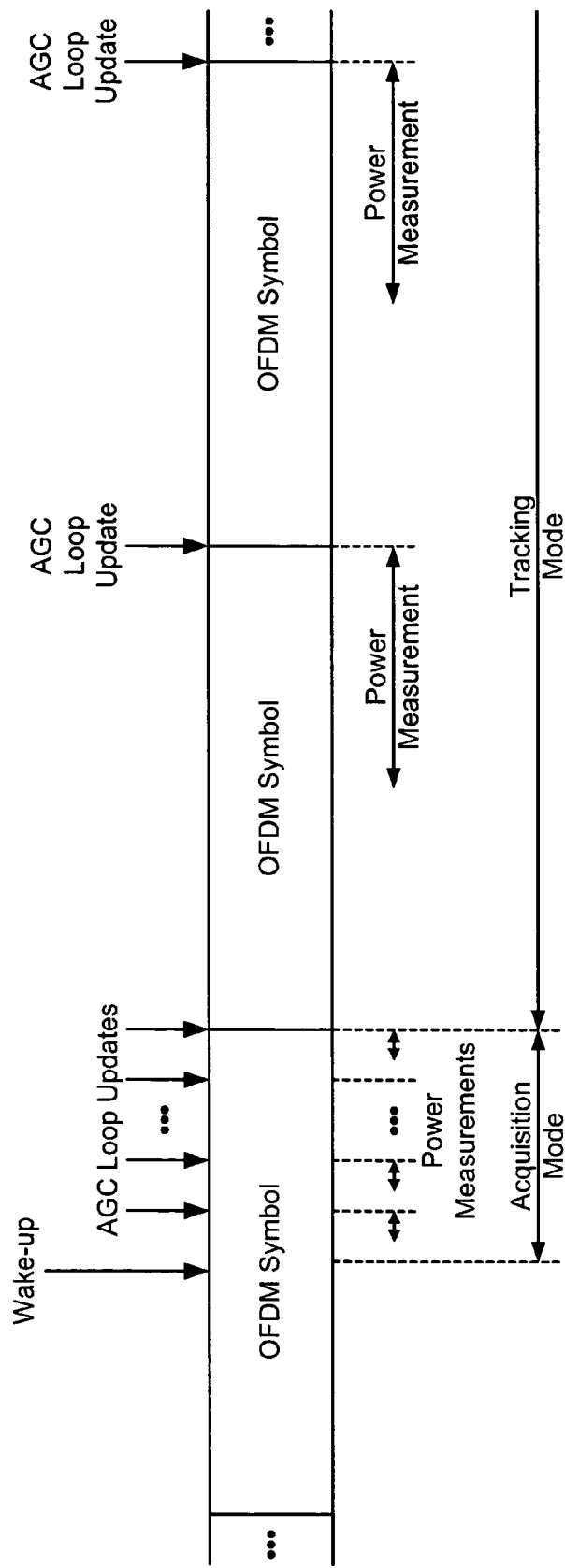
FIG. 8 shows AGC operation in the acquisition and tracking modes.

FIG. 8 illustrates an embodiment of AGC operation in the acquisition mode and the tracking mode. Receiver 150 starts in the acquisition mode upon power up and also at the start of a wakeup period. In the acquisition mode, the AGC loop is updated at a faster rate and with a first loop gain value to achieve fast convergence and to closely track the received signal level. Each update interval spans $T_{acq}$ seconds in the acquisition mode, e.g., $T_{acq}$=256 sample periods for the super-frame structure shown in FIG. 7. In an embodiment, in each update interval, receiver 150 obtains a power measurement based on output samples in the later part of the update interval, e.g., the last 128 samples in a 256-sample update interval. If the analog and/or digital gain was changed in the prior update interval, then transients may be introduced in the output samples. The transients may be avoided by discarding output samples in the earlier part (e.g., the first half) of the update interval and using output samples in the later part (e.g., the second half) of the update interval for power measurement. Receiver 150 then updates the AGC loop based on the power measurement.

Receiver 150 may remain in the acquisition mode until (1) coarse timing is obtained and OFDM symbol boundary can be ascertained and/or (2) some other conditions are satisfied. For example, receiver 150 may remain in the acquisition mode for some minimum number of (e.g., 16) update intervals. Receiver 150 may then switch to the tracking mode. In the tracking mode, the AGC loop is updated at a slower rate and with a second loop gain value. Each update interval spans $T_{track}$ seconds in the tracking mode, e.g., $T_{track}$=1 one OFDM symbol period. In an embodiment, in each update interval, the receiver obtains a power measurement based on output samples in the later part (e.g., the second half) of the update interval, again to avoid transients caused by gain switching. Receiver 150 then updates the AGC loop based on the power measurement. In general, the first and second loop gain values may each be selected to achieve the desired convergence rate and time averaging. The first loop gain value may be equal to, larger than, or smaller than the second loop gain value.

FIG. 9 shows an embodiment of a process 900 for performing AGC with discrete analog gain and continuous digital gain. An AGC loop is updated based on power measurements, e.g., for an output signal from a DVGA (block 912). A first gain for analog circuitry is selected from among multiple discrete gain values based on the AGC loop to maintain the average power of a baseband signal within a predetermined range at an ADC input (block 914). A second gain for the DVGA is selected based on the AGC loop to maintain the average power of the output signal from the DVGA at or near a reference power level (block 916). The baseband signal may be an OFDM waveform having high PAPR. The predetermined range at the ADC input may be a first backoff below the ADC fullscale, where the first backoff may be selected based on the PAPR of the baseband signal, or the power of various interference (jammers). The reference power level may be a second backoff below the DVGA fullscale, where the second backoff may be selected based on the PAPR of the output signal from the DVGA.

For block 914, a next higher discrete gain value, if available, may be selected for the first gain when the average power of the baseband signal is below a low threshold. A next lower discrete gain value, if available, may be selected for the first gain when the average power of the baseband signal is above a high threshold. The multiple discrete gain values may be associated with multiple gain states. Each gain state may be associated with a respective high threshold (if applicable) and a respective low threshold (if applicable). The high and low thresholds for the gain states may be defined to provide the desired gain switching characteristics and to provide the desired switching hysteresis. The high and low thresholds for the current gain state may be used to determine whether to switch gain state.

FIG. 10 shows an embodiment of an apparatus 1000 for performing AGC with discrete analog gain and continuous digital gain. Apparatus 1000 includes means for updating an AGC loop based on power measurements, e.g., for an output signal from a DVGA (block 1012), means for selecting a first gain for analog circuitry from among multiple discrete gain values to maintain the average power of a baseband signal within a predetermined range at an ADC input (block 1014), and means for selecting a second gain for the DVGA to maintain the average power of the DVGA output signal at or near a reference power level (block 916).

Figures 11, 12:
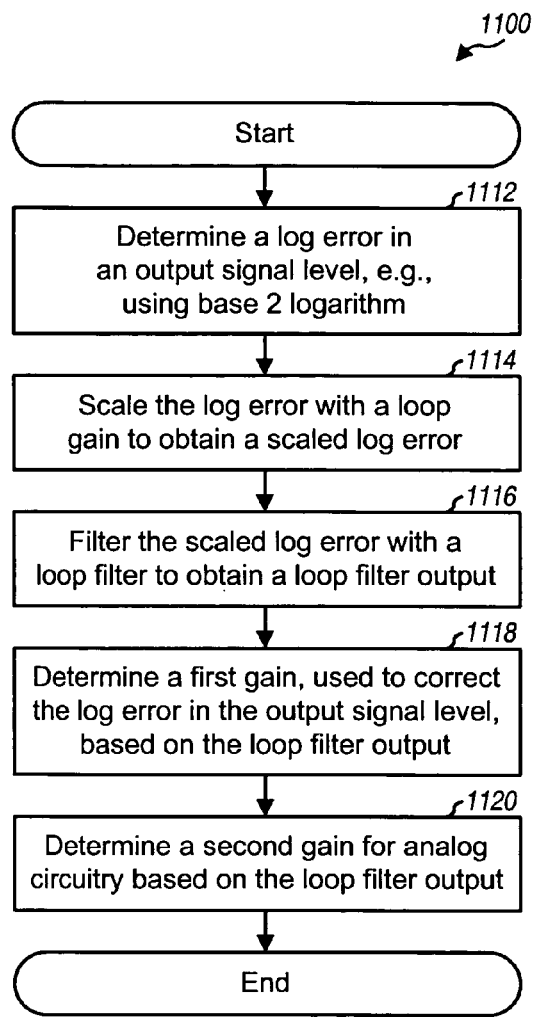
FIGS. 11 and 12 show a process and an apparatus, respectively, for performing AGC in log domain.

FIG. 11 shows an embodiment of a process 1100 for performing AGC in log domain. A log error of an output signal level from a reference level is determined, e.g., using base 2 logarithm (block 1112). The log error is scaled with a loop gain to obtain a scaled log error (block 1114). The scaled log error is filtered with a loop filter to obtain a loop filter output (block 1116). Different values may be used for the loop gain in the acquisition and tracking modes. A first gain used to correct the log error in the output signal level is determined based on the loop filter output (block 1118). The first gain may comprise a first part that is a power of two and a second part that is in linear unit. An input signal may be digitally multiplied with the first gain to obtain the output signal, and the log error may be determined based on the output signal level and a reference power level.

A second gain for analog circuitry may also be determined based on the loop filter output (block 1120). Multiple discrete gain values may be available for the second gain. One discrete gain value may be selected for the second gain based on the loop filter output. The first gain may then be determined based on the loop filter output and the second gain.

FIG. 12 shows an embodiment of an apparatus 1200 for performing AGC in log domain. Apparatus 1200 includes means for determining a log error in an output signal level, e.g., using base 2 logarithm (block 1212), means for scaling the log error with a loop gain to obtain a scaled log error (block 1214), means for filtering the scaled log error with a loop filter to obtain a loop filter output (block 1216), means for determining a first gain, used to correct the log error in the output signal level, based on the loop filter output (block 1218), and means for determining a second gain for analog circuitry based on the loop filter output (block 1220).

Figure 13:
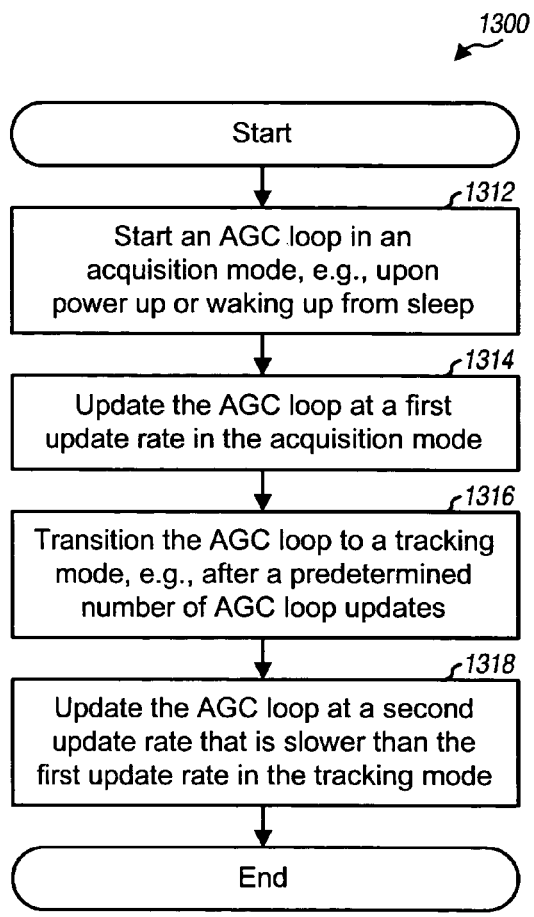
FIGS. 13 and 14 show a process and an apparatus, respectively, for performing AGC with multiple modes.

FIG. 13 shows an embodiment of a process 1300 for performing AGC with multiple modes. An AGC loop starts in an acquisition mode, e.g., upon power up or waking up from sleep (block 1312). The AGC loop is updated at a first update rate and with a first loop gain value in the acquisition mode (block 1314). The AGC loop transitions to a tracking mode, e.g., after a predetermined number of AGC loop updates or upon satisfaction of some other conditions (block 1316). The AGC loop is updated at a second update rate that is slower than the first update rate with a second loop gain value in the tracking mode (block 1318). For example, the AGC loop may be updated (1) multiple times for each OFDM symbol in the acquisition mode and (2) once for each span of at least one OFDM symbol, e.g., each OFDM symbol, and at the OFDM symbol boundary, in the tracking mode. Power measurements used to update the AGC loop may be derived based on (1) a first predetermined number of samples in the acquisition mode and (2) a second predetermined number of samples in the tracking mode, wherein the second predetermined number is larger than the first predetermined number. The first loop gain value may be equal to, greater than, or less than the second loop gain value.

Figure 14:
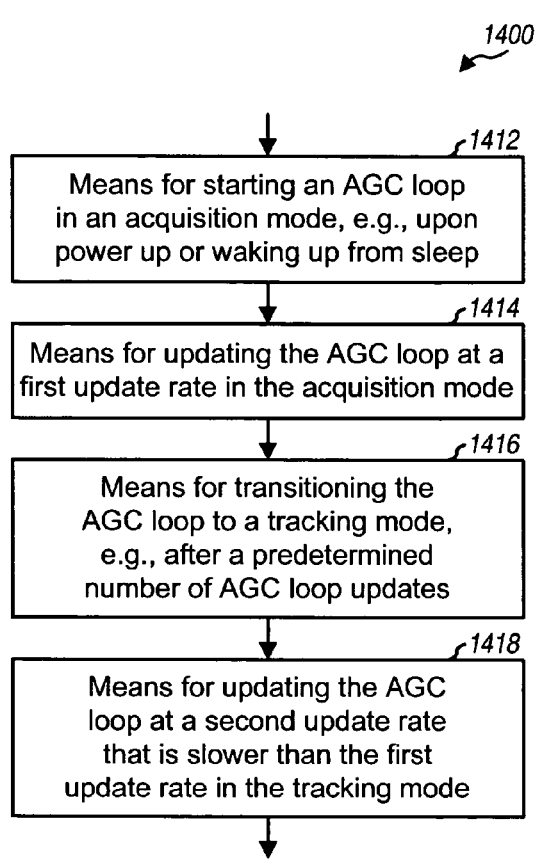

FIG. 14 shows an embodiment of an apparatus 1400 for performing AGC with multiple modes. Apparatus 1400 includes means for starting an AGC loop in an acquisition mode, e.g., upon power up or waking up from sleep (block 1412), means for updating the AGC loop at a first update rate and with a first loop gain value in the acquisition mode (block 1414), means for transitioning the AGC loop to a tracking mode, e.g., after a predetermined number of AGC loop updates or upon satisfaction of some other conditions (block 1416), and means for updating the AGC loop at a second update rate that is slower than the first update rate and with a second loop gain value in the tracking mode (block 1418).

The AGC techniques described herein may be implemented by various means. For example, these techniques may be implemented in hardware, firmware, software, or a combination thereof. For a hardware implementation, the processing units used to perform AGC may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the techniques may be implemented with modules (e.g., procedures, functions, and so on) that perform the functions described herein. The firmware and/or software codes may be stored in a memory (e.g., memory 182 in FIG. 1) and executed by a processor (e.g., processor 180). The memory may be implemented within the processor or external to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
an automatic gain control (AGC) controller configured to provide a control signal that indicates an average power of a baseband signal;
a digital gain computation unit coupled to the AGC controller, the digital gain computation unit configured to receive the control signal from the AGC controller and to select a digital gain such that the average power of an output signal from a digital variable gain amplifier is maintained at a reference power level;
at least one processor configured to select a first gain for analog circuitry from among multiple discrete gain values and to select a second gain for the DVGA, wherein the first gain maintains average power of the baseband signal within a predetermined range at an input of an analog-to-digital converter (ADC), and wherein the second gain maintains the average power of the output signal from the DVGA at the reference power level, wherein the multiple discrete gain values are associated with multiple gain states, wherein each gain state except for a lowest gain state with a lowest analog gain is associated with a respective high threshold used for selecting a next lower gain state, and wherein each gain state except for a highest gain state with a highest analog gain is associated with a respective low threshold used for selecting a next higher gain state; and
a memory coupled to the at least one processor.

2. The apparatus of claim 1, wherein the baseband signal is an OFDM waveform.

3. The apparatus of claim 1, wherein the predetermined range is at least a particular backoff below fullscale for the ADC, and wherein the particular backoff is selected based on a peak-to-average-power ratio (P APR) of the baseband signal, power of interfering signals, or a combination thereof.

4. The apparatus of claim 1, wherein the reference power level is a particular backoff below fullscale for the DVGA, and wherein the particular backoff is selected based on a peak-to-average-power ratio (P APR) of the output signal.

5. The apparatus of claim 1, wherein the at least one processor is configured to update an automatic gain control (AGC) loop based on power measurements and to select the first and second gains based on the AGC loop.

6. The apparatus of claim 5, wherein the at least one processor is configured to determine the average power of the baseband signal based on an output of the AGC loop and the discrete gain value for the first gain.

7. The apparatus of claim 1, wherein the at least one processor is configured to select a next higher discrete gain value, if available, for the first gain when the average power of the baseband signal is below a low threshold, and to select a next lower discrete gain value, if available, for the first gain when the average power of the baseband signal is above a high threshold.

8. The apparatus of claim 7, wherein the high and low thresholds are dependent on the discrete gain value for the first gain.

9. The apparatus of claim 7, wherein the high and low thresholds are defined based on ADC backoff and signal-to-quantization noise ratio (SQR) requirements.

10. The apparatus of claim 1, wherein the high and low thresholds for the multiple gain states are defined to provide a predetermined amount of hysteresis in switching between gain states.

11. The apparatus of claim 1, wherein the high and low thresholds for the multiple gain states are programmable.

12. The apparatus of claim 1, wherein the at least one processor is configured to determine a change in the first gain, and to delay applying the change in the second gain such that the change is applied concurrently to the analog circuitry and the DVGA to reduce transients in the output signal.

13. A processor configured to select a first gain for analog circuitry from among multiple discrete gain values and to select a second gain for a digital variable gain amplifier (DVGA), wherein the first gain maintains average power of a baseband signal within a predetermined range at an input of an analog-to-digital converter (ADC), and wherein the second gain maintains average power of an output signal from the DVGA at a reference power level, wherein the multiple discrete gain values are associated with multiple gain states, wherein each gain state except for a lowest gain state with a lowest analog gain is associated with a respective high threshold used for selecting a next lower gain state, wherein each gain state except for a highest gain state with a highest analog gain is associated with a respective low threshold used for selecting a next higher gain state.

14. The processor of claim 13, and further configured to update an automatic gain control (AGC) loop based on power measurements and to select the first and second gains based on the AGC loop.

15. The processor of claim 13, and further configured to select a next higher discrete gain value, if available, for the first gain when the average power of the baseband signal is below a low threshold, and to select a next lower discrete gain value, if available, for the first gain when the average power of the baseband signal is above a high threshold.

16. A method comprising:
selecting a first gain for analog circuitry from among multiple discrete gain values, wherein the first gain maintains average power of a baseband signal within a predetermined range at an input of an analog-to-digital converter (ADC), wherein the predetermined range is at least a particular backoff below fullscale for the ADC; and
selecting a second gain for a digital variable gain amplifier (DVGA), wherein the second gain maintains average power of an output signal from the DVGA at a reference power level, wherein the multiple discrete gain values are associated with multiple gain states, wherein each gain state except for a lowest gain state with a lowest analog gain is associated with a respective high threshold used for selecting a next lower gain state, and wherein each gain state except for a highest gain state with a highest analog gain is associated with a respective low threshold used for selecting a next higher gain state.

17. The method of claim 16, further comprising:
updating an automatic gain control (AGC) loop based on power measurements, and wherein the first and second gains are selected based on the AGC loop.

18. The method of claim 16, wherein the selecting the first gain for the analog circuitry comprises selecting a next higher discrete gain value, if available, for the first gain when the average power of the baseband signal is below a low threshold, and selecting a next lower discrete gain value, if available, for the first gain when the average power of the baseband signal is above a high threshold.

19. An apparatus comprising:
means for selecting a first gain for analog circuitry from among multiple discrete gain values, wherein the first gain maintains average power of a baseband signal within a predetermined range at an input of an analogto-digital converter (ADC), wherein the predetermined range is at least a particular backoff below fullscale for the ADC; and means for selecting a second gain for a digital variable gain amplifier (DVGA), wherein the second gain maintains average power of an output signal from the DVGA at a reference power level, wherein the multiple discrete gain values are associated with multiple gain states, wherein each gain state except for a lowest gain state with a lowest analog gain is associated with a respective high threshold used for selecting a next lower gain state, and wherein each gain state except for a highest gain state with a highest analog gain is associated with a respective low threshold used for selecting a next higher gain state.

20. The apparatus of claim 19, further comprising:
means for updating an automatic gain control (AGC) loop based on power measurements, and wherein the first and second gains are selected based on the AGC loop.

21. The apparatus of claim 19, wherein the means for selecting the first gain for the analog circuitry comprises means for selecting a next higher discrete gain value, if available, for the first gain when the average power of the baseband signal is below a low threshold, and
means for selecting a next lower discrete gain value, if available, for the first gain when the average power of the baseband signal is above a high threshold.

22. Non-transitory computer-readable medium encoded with a computer program to:
select a first gain for analog circuitry from among multiple discrete gain values, wherein the first gain maintains average power of a baseband signal within a predetermined range at an input of an analog-to-digital converter (ADC), wherein the predetermined range is at least a particular backoff below fullscale for the ADC; and
select a second gain for a digital variable gain amplifier (DVGA), wherein the second gain maintains average power of an output signal from the DVGA at a reference power level, wherein the multiple discrete gain values are associated with multiple gain states, wherein each gain state except for a lowest gain state with a lowest analog gain is associated with a respective high threshold used for selecting a next lower gain state, and wherein each gain state except for a highest gain state with a highest analog gain is associated with a respective low threshold used for selecting a next higher gain state.

23. An apparatus comprising:
at least one processor configured to update an automatic gain control (AGC) loop at a first update rate and with a first loop gain in an acquisition mode and to update the AGC loop at a second update rate and with a second loop gain in a tracking mode, wherein the second update rate is slower than the first update rate and the first loop gain is smaller than the second loop gain, wherein the at least one processor is configured to update the AGC loop multiple times for each OFDM symbol in the acquisition mode and to update the AGC loop once for each span of at least one OFDM symbol in the tracking mode; and
a memory coupled to the at least one processor.

24. The apparatus of claim 23, wherein the at least one processor is configured to update the AGC loop at OFDM symbol boundaries in the tracking mode.

25. The apparatus of claim 23, wherein the at least one processor is configured to start in the acquisition mode upon waking up from sleep and to remain in the acquisition mode for at least a predetermined number of AGC loop updates or until satisfaction of an exit condition prior to transitioning to the tracking mode.

26. The apparatus of claim 23, wherein the at least one processor is configured to derive power measurements based on a first predetermined number of samples in the acquisition mode, to derive power measurements based on a second predetermined number of samples in the tracking mode, wherein the second predetermined number is larger than the first predetermined number, and to update the AGC loop with the power measurements.

27. The apparatus of claim 23, wherein the at least one processor is configured to update the AGC loop with a first loop gain value in the acquisition mode and to update the AGC loop with a second loop gain value in the tracking mode.

28. A processor configured to update an automatic gain control (AGC) loop at a first update rate and with a first loop gain in an acquisition mode and to update the AGC loop at a second update rate and with a second loop gain in a tracking mode, and further configured to update the AGC loop multiple times for each OFDM symbol in the acquisition mode and to update the AGC loop once for each span of at least one OFDM symbol in the tracking mode, wherein the second update rate is slower than the first update rate and the first loop gain is smaller than the second loop gain.

29. The processor of claim 28, and further configured to derive power measurements based on a first predetermined number of samples in the acquisition mode, to derive power measurements based on a second predetermined number of samples in the tracking mode, wherein the second predetermined number is larger than the first predetermined number, and to update the AGC loop with the power measurements.

30. A method comprising:
updating, by a processor, an automatic gain control (AGC) loop at a first update rate and with a first loop gain in an acquisition mode, comprising updating the AGC loop multiple times for each OFDM symbol in the acquisition mode; and
updating the AGC loop at a second update rate and with a second loop gain in a tracking mode, wherein the second update rate is slower than the first update rate and the first loop gain is smaller than the second loop gain, comprising updating the AGC loop once for each span of at least one OFDM symbol in the tracking mode.

31. The method of claim 30, further comprising:
deriving power measurements based on a first predetermined number of samples in the acquisition mode;
deriving power measurements based on a second predetermined number of samples in the tracking mode, wherein the second predetermined number is larger than the first predetermined number; and
updating the AGC loop with the power measurements.

32. An apparatus comprising:
means for updating an automatic gain control (AGC) loop at a first update rate and with a first loop gain in an acquisition mode, comprising means for updating the AGC loop multiple times for each OFDM symbol in the acquisition mode; and
means for updating the AGC loop at a second update rate and with a second loop gain in a tracking mode, wherein the second update rate is slower than the first update rate and the first loop gain is smaller than the second loop gain, comprising means for updating the AGC loop once for each span of at least one OFDM symbol in the tracking mode.

33. The apparatus of claim 32, further comprising:
means for deriving power measurements based on a first predetermined number of samples in the acquisition mode;

means for deriving power measurements based on a second predetermined number of samples in the tracking mode, wherein the second predetermined number is larger than the first predetermined number; and means for updating the AGC loop with the power measurements.

34. Non-transitory computer-readable medium encoded with a computer program to:

update an automatic gain control (AGC) loop at a first update rate and with a first loop gain in an acquisition mode, wherein updating the AGC loop at the first update rate in the acquisition mode comprises updating the AGC loop multiple times for each OFDM symbol in the acquisition mode, and update the AGC loop at a second update rate and with a second loop gain in a tracking mode, wherein the second update rate is slower than the first update rate and the first loop gain is smaller than the second loop gain, wherein updating the AGC loop at the second update rate in the tracking mode comprises updating the AGC loop once for each span of at least one OFDM symbol in the tracking mode.

* * * * *